United States Patent
Kiyokawa

(10) Patent No.: US 8,493,083 B2
(45) Date of Patent: Jul. 23, 2013

(54) TEST APPARATUS, TEST METHOD AND COMPUTER READABLE MEDIUM

(75) Inventor: Toshiyuki Kiyokawa, Saitama (JP)

(73) Assignee: Advantest Corporation, Tokyo (JP)

( * ) Notice: Subject to any disclaimer, the term of this patent is extended or adjusted under 35 U.S.C. 154(b) by 280 days.

(21) Appl. No.: 12/869,545

(22) Filed: Aug. 26, 2010

(65) Prior Publication Data

US 2011/0128024 A1 Jun. 2, 2011

Related U.S. Application Data

(63) Continuation of application No. PCT/JP2009/004333, filed on Sep. 2, 2009.

(51) Int. Cl.
*G01R 31/00* (2006.01)
*G01R 31/20* (2006.01)

(52) U.S. Cl.
USPC ............................ 324/750.16; 324/757.01

(58) Field of Classification Search
USPC ........................ 324/750.16, 757.01
See application file for complete search history.

(56) References Cited

U.S. PATENT DOCUMENTS

| | | | | |
|---|---|---|---|---|
| 5,644,245 | A * | 7/1997 | Saitoh et al. | 324/750.18 |
| 5,931,048 | A * | 8/1999 | Slocum et al. | 74/490.07 |
| 6,111,421 | A * | 8/2000 | Takahashi et al. | 324/750.04 |
| 6,366,103 | B1 * | 4/2002 | Cheng | 324/750.16 |
| 7,196,507 | B2 * | 3/2007 | Schneidewind et al. | 324/750.16 |
| 7,701,236 | B2 * | 4/2010 | Akiyama et al. | 324/750.16 |
| 8,311,758 | B2 * | 11/2012 | Casler et al. | 702/94 |
| 8,319,514 | B2 * | 11/2012 | Sano et al. | 324/762.05 |
| 8,395,401 | B2 * | 3/2013 | Ishii | 324/750.16 |
| 2006/0132155 | A1 | 6/2006 | Yamada et al. | |
| 2006/0152211 | A1 * | 7/2006 | Iijima et al. | 324/158.1 |
| 2009/0183363 | A1 | 7/2009 | Yamada et al. | |

FOREIGN PATENT DOCUMENTS

| | | |
|---|---|---|
| JP | 5-95030 A | 4/1993 |
| JP | H07-231019 A | 8/1995 |
| JP | H11-154694 A | 6/1999 |
| JP | 2006-173503 A | 6/2006 |
| JP | 2008-164292 A | 7/2008 |

OTHER PUBLICATIONS

The explanation of circumstances concerning the accelerated examination dated Sep. 9, 2009, PCT/JP2009/004333 (parent application) submitted to Japanese Patent Office. Concise Explanation of Relevance: This document citing Foreign Patent document Nos. 1-3 listed above.
International Search Report (ISR) issued in PCT/JP2009/004333 (parent application) mailed in Oct. 2009 for Examiner consideration, citing Foreign Patent document Nos. 1-2 listed above and JP11-154694, which has been submitted in a previous IDS.
Written Opinion (PCT/ISA/237) issued in PCT/JP2009/004333 mailed in Oct. 2009.

* cited by examiner

*Primary Examiner* — Joshua Benitez Rosario

(57) ABSTRACT

A test apparatus comprising a position information acquiring section that acquires position information concerning first terminals on a surface of a device under test and position information concerning second terminals on a surface of a probe card used for testing the device under test; a control section that calculates a displacement amount between each first terminal and a corresponding second terminal, based on the position information concerning the first terminals and the position information concerning the second terminals, and determines relative positions of the device under test and the probe card such that a maximum value from among the calculated displacement amounts is less than a predetermined value; and an aligning section that adjusts the relative positions of the device under test and the probe card, based on a signal from the control section, and electrically connects the device under test to the probe card.

8 Claims, 12 Drawing Sheets

TEST APPARATUS, TEST METHOD AND COMPUTER READABLE MEDIUM

BACKGROUND

1. Technical Field

The present invention relates to a test apparatus, a test method, and a computer readable medium.

2. Related Art

When testing a plurality of semiconductor chips en masse on a semiconductor wafer, a probe card is used that has a large number of bumps corresponding to the test pads of the semiconductor chip.

Since the test pads and the bumps are extremely small, in order to accurately align the bumps with the corresponding test pads, alignment marks are formed on both the semiconductor wafer and the probe card, and these alignment marks are used to set the positions of the semiconductor wafer and the probe card, as shown in Patent Documents 1 to 3.

Patent Document 1: Japanese Patent No. 4187718
Patent Document 2: Japanese Patent Application Publication No. H07-231019
Patent Document 3: Japanese Patent Application Publication No. H11-154694

Even when the semiconductor wafer and the probe card are positioned with a high degree of accuracy, misalignment can occur between the test pad and the bumps due to manufacturing errors in the semiconductor wafer, the probe card, or the alignment mark or due to deformation of the semiconductor wafer or the probe card as the result of a temperature change.

SUMMARY

Therefore, it is an object of an aspect of the innovations herein to provide a test apparatus, a test method, and a computer readable medium, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary test apparatus may comprise a position information acquiring section that acquires position information concerning a plurality of first terminals on a surface of a device under test and position information concerning a plurality of second terminals on a surface of a probe card used for testing the device under test; a control section that calculates a displacement amount between each first terminal and a corresponding second terminal, based on the position information concerning the first terminals and the position information concerning the second terminals acquired by the position information acquiring section, and determines relative positions of the device under test and the probe card such that a maximum value from among the calculated displacement amounts is less than a predetermined value; and an aligning section that adjusts the relative positions of the device under test and the probe card, based on a signal from the control section, and electrically connects the device under test to the probe card. The above test apparatus may further comprise a plurality of the probe cards; and a plurality of test heads that correspond to the plurality of probe cards and test the device under test. Each probe card may electrically connect the device under test to the corresponding test head.

According to a second aspect related to the innovations herein, one exemplary test apparatus may comprise a position information acquiring section that acquires position information concerning a plurality of first terminals on a surface of a device under test and position information concerning a plurality of second terminals on a surface of a probe card used for testing the device under test; a control section that calculates a displacement amount between each first terminal and a corresponding second terminal, based on the position information concerning the first terminals and the position information concerning the second terminals acquired by the position information acquiring section, and determines relative positions of the device under test and the probe card such that a maximum value from among the calculated displacement amounts is less than a predetermined value; a first storage section that stores, in association with each second terminal, the displacement amount corresponding to the relative positions determined by the control section; an aligning section that adjusts the relative positions of the device under test and the probe card, based on a signal from the control section, and electrically connects the device under test to the probe card; a test head that tests the device under test electrically connected to the probe card; a second storage section that stores results of the test in association with each second terminal; and an analyzing section that, when the test indicates that the device under test is defective, (i) judges there to be a problem in the device under test or the probe card when the displacement amount of a location of the defect is less than a predetermined value and (ii) judges there to be a problem in the connection between the device under test and the probe card when the displacement amount of the location of the defect is greater than the predetermined value.

In the above test apparatuses, the position information acquiring section may be an image capturing section that captures an image of at least one of the surface of the device under test and the surface of the probe card.

According to a third aspect related to the innovations herein, one exemplary test method may comprise acquiring position information concerning a plurality of first terminals on a surface of a device under test and position information concerning a plurality of second terminals on a surface of a probe card used for testing the device under test; calculating a displacement amount between each first terminal and a corresponding second terminal, based on the position information concerning the first terminals and the position information concerning the second terminals; and aligning the device under test and the probe card such that a maximum value among the calculated displacement amounts is less than a predetermined value.

In the above test method, the device under test and the probe card may be aligned in a manner to minimize the maximum value among the displacement amounts. The aligning may include calculating the maximum value among the plurality of displacement amounts for each of a plurality of relative positions of the device under test and the probe card; and determining the relative positions of the device under test and the probe card based on the maximum values among the displacement amounts calculated for the plurality of relative positions.

In the above test method, acquiring the position information may include preparing a plurality of the probe cards and acquiring the position information concerning the second terminals for each probe card; the aligning may include determining the relative positions of the device under test and each probe card such that the maximum value among the displacement amounts for each probe card is less than a predetermined value, and selecting one of the probe cards based on the maximum values of the displacement amounts for the determined relative positions; and the device under test may be aligned with the selected probe card based on the determined relative positions.

The above test method may further comprise calculating a displacement amount between each second terminal and the corresponding first terminal in an aligned state, based on the position information concerning the first terminals and the position information concerning the second terminals; storing the displacement information in the aligned state for each second terminal; testing the device under test; storing results of the test in association with each second terminal; and when the test indicates that the device under test is defective, (i) judging there to be a problem in the device under test or the probe card when the displacement amount in the aligned state of a location of the defect is less than a predetermined value and (ii) judging there to be a problem in the connection between the device under test and the probe card when the displacement amount in the aligned state of the location of the defect is greater than the predetermined value.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
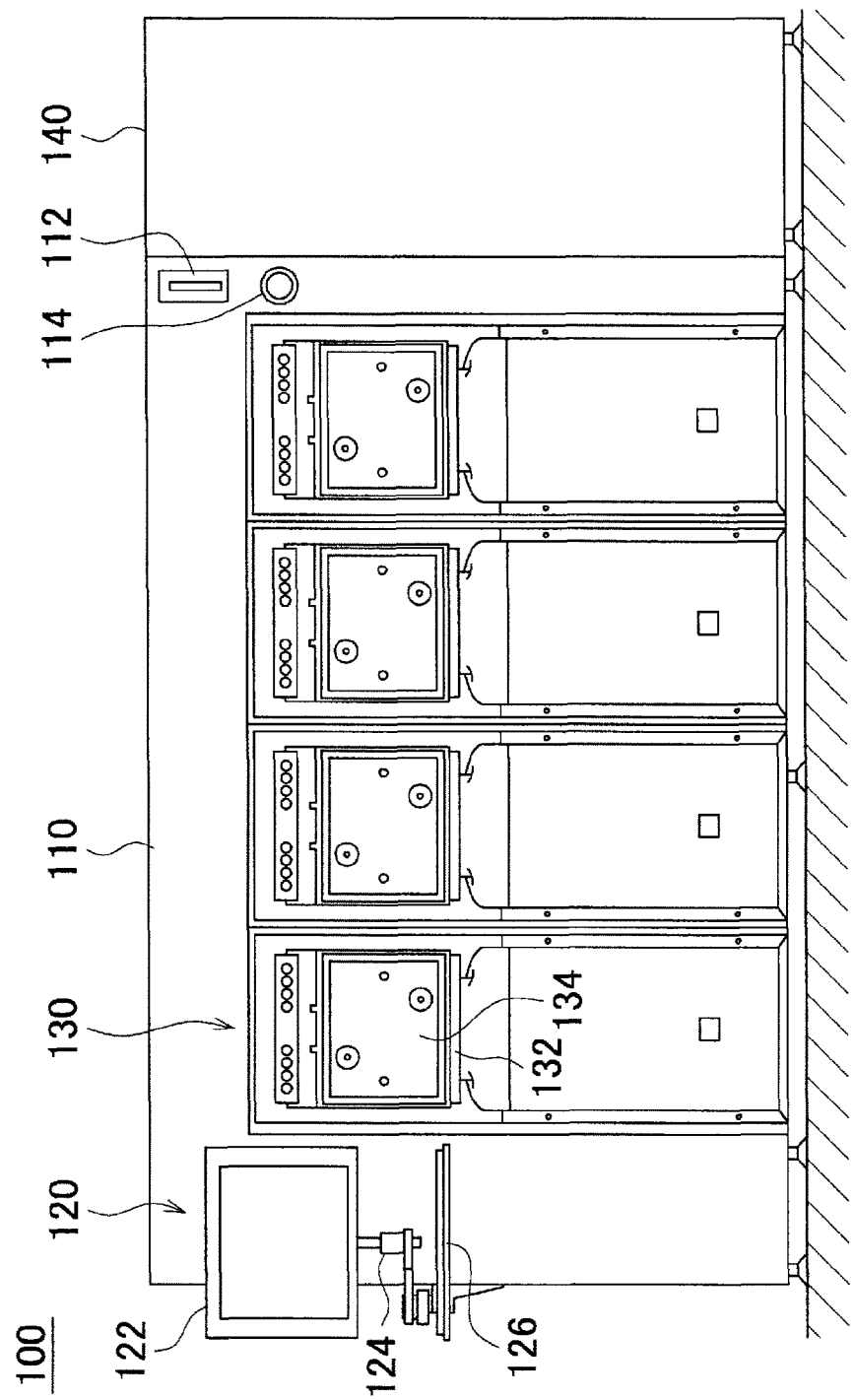
FIG. 1 shows a schematic front view of an exemplary test apparatus 100.

FIG. 1 shows a schematic front view of an exemplary test apparatus 100. The test apparatus 100 includes an EFEM 110, an operating section 120, a load unit 130, and a cooling unit 140. The test apparatus 100 may test electrical characteristics of a device such as a semiconductor chip formed on a semiconductor wafer, to judge the acceptability of this device under test. The test apparatus 100 may test en masse a plurality of semiconductor chips formed on the semiconductor wafer. The semiconductor wafer and the semiconductor chips are examples of a device under test.

The EFEM 110 houses a mechanism for transporting a substrate of the semiconductor wafer or the like serving as a test target within the test apparatus 100. The EFEM 110 is an example of a transporting section that transports the device under test. In the present embodiment, the EFEM 110 has the greatest dimensions within the test apparatus 100, and so a signal lamp 112 indicating the operational state of the test apparatus 100 and an EMO 114 that operates when the test apparatus 100 stops unexpectedly are arranged at a high position on the front surface of the EFEM 110.

The operating section 120 includes a display 122, an arm 124, and an input apparatus 126. In the present embodiment, the operating section 120 is supported by the EFEM 110. One end of the arm 124 is coupled to the EFEM 110, and the other end supports the display 122 and the input apparatus 126 in a manner to be freely movable.

The display 122 includes a liquid crystal display device or a touch panel display, and displays the operational state of the test apparatus 100 or echo back of input content from the input apparatus 126, for example. The input apparatus 126 may include a keyboard, a mouse, a tracking ball, a jog wheel, a touch panel display, or s storage medium reading device, for example, and receives information or instructions relating to settings or operations of the test apparatus 100. These instructions may be input to the test apparatus 100 from another computer via a communication line.

The load unit 130 includes a load table 132 and a load gate 134. A container housing the semiconductor wafer, which serves as the test target, is placed on the load table 132. The load gate 134 opens and closes when the semiconductor wafer is transported to and from the test apparatus 100. As a result, the semiconductor wafer can be loaded from the outside without decreasing the cleanliness inside the test apparatus 100.

The cooling unit 140 may cool a wafer that is heated by testing in the test apparatus 100, prior to transportation of the wafer. Transportation of the wafer to and from the cooling unit 140 can be achieved using the EFEM 110, for example. The cooling unit 140 may adjust the temperature of cold water and supply this cold water to air-conditioning equipment that controls the temperature within the test apparatus 100. The cooling unit 140 may be arranged adjacent to the EFEM 110, or may be arranged between the load unit 130 and the test head that executes the testing.

Figure 2:
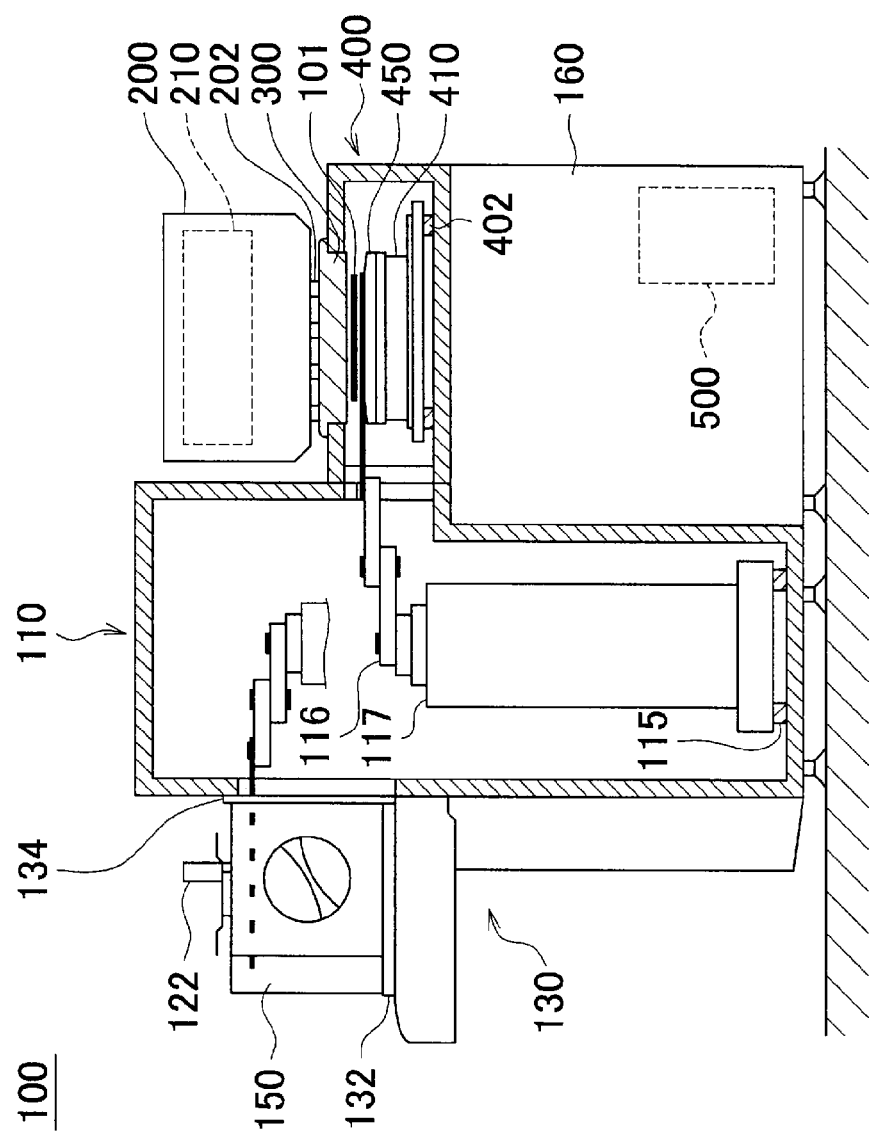
FIG. 2 shows a partial vertical cross section of the test apparatus 100.

FIG. 2 is a schematic view of a partial vertical cross section of the test apparatus 100. Components that are the same as those in FIG. 1 are given the same reference numerals and redundant descriptions are omitted. The test apparatus 100 includes the load unit 130, the EFEM 110, a mainframe 160, an alignment unit 400, a probe card 300, and a test head 200. In FIG. 2, the cooling unit 140 is not shown.

In the present embodiment, the load unit 130, the EFEM 110, and the mainframe 160 are arranged adjacently in the stated order from front to back, which is from the left side to the right side of FIG. 2. The alignment unit 400, the probe card 300, and the test head 200 are layered on top of the mainframe 160. The load unit 130 and the alignment unit 400 are connected to the EFEM 110 in such a manner as to be air-tight with respect to the outside, and a high level of cleanliness is maintained in each of these units.

A FOUP 150 is placed on the load table 132 of the load unit 130. The FOUP 150 houses a plurality of wafers 101 serving as test targets. The FOUP 150 also stores wafers if the wafers 101 are collected after testing.

The EFEM 110 houses the robotic arm 116. The robotic arm 116 is loaded on a column 117 that runs along a rail 115. The wafers are transported between the load unit 130 and the alignment unit 400. The robotic arm 116 takes the wafers 101 one at a time from the FOUP 150 through the load gate 134, and transports the wafers 101 to the alignment unit 400.

The mainframe 160 controls the operation of each section in the test apparatus 100. In the present embodiment, the mainframe 160 includes a control system 500 that controls the operation of the test head 200 and the alignment unit 400. The control system 500 may reflect the input received by the input apparatus 126 of the operating section 120 in each section of the test apparatus 100. The control system 500 may generate display content that reflects the operational state of the test apparatus 100 and display this content in the display 122. The control system 500 is an example of a control section.

The control system 500 may control the operation of the test head 200 according to a test program. The control system 500 may synchronize operation of the load unit 130, the EFEM 110, and the alignment unit 400 to pass the wafers 101 therebetween. When the EMO 114 is operated, the control system 500 may immediately stop the operation of each section of the test apparatus 100.

The control system 500 may be connected to another test apparatus, a probe card 300 manufacturing apparatus, or a device under test manufacturing apparatus via a communication line. In this way, the control system 500 can acquire, via the communication line, test results for devices under test from other test apparatuses or information concerning the designing or manufacturing of devices under test or probe cards. The control system 500 may acquire this information from the operating section 120.

The test head 200 is electrically connected to a wafer 101 and tests electrical characteristics of the wafer 101. The test head 200 may perform a burn-in test of the wafer 101. The test head 200 houses a plurality of pin electronics 210. The pin electronics 210 each include an electrical circuit according to the content of a test and the test target. In the present embodiment, the test head 200 is electrically connected to the probe card 300 via a contactor 202 mounted on the bottom surface of the test head 200.

The probe card 300 is used to test the device under test. The probe card 300 may be a circuit board that is inserted between the test head 200 and the wafer 101 to provide an electrical connection therebetween when the test apparatus 100 is performing a test. When testing a wafer 101, the probe card 300 is used to form an electrical signal path between the test head 200 and the wafer 101. By replacing the probe card 300, the test apparatus 100 can be adapted to wafers 101 with different layouts.

The alignment unit 400 adjusts the relative positions of the wafer 101 and the probe card 300 based on a signal from the control system 500, and electrically connects the wafer 101 and the probe card 300 to each other. The alignment unit 400 may electrically connect a probe card 300 selected by the control system 500 to the wafer 101, based on the signal from the control system 500. The alignment unit 400 is an example of an aligning section.

In the present embodiment, the alignment unit 400 includes an alignment stage 410. The alignment stage 410 has the wafer tray 450 and the wafer 101 loaded thereon, and runs along a rail 402. The alignment stage 410 adjusts the relative positions of the wafer 101 and the probe card 300 to align the probe card 300 and the wafer 101 with each other.

In the present embodiment, the alignment stage 410 can extend and contract vertically to raise and lower a wafer 101 that is loaded thereon. By moving the wafer 101 toward the probe card 300, the alignment stage 410 can press the wafer 101 against the probe card 300. As a result, the terminals on the surface of the wafer 101 contact corresponding terminals on the surface of the probe card 300. In the present Specification, "corresponding terminals" are terminals that are electrically connected to each other when testing the device under test. The test pads of the wafer 101 and the bumps of the probe card 300 are examples of corresponding terminals.

The present embodiment describes an example in which the alignment stage 410 extends and contracts vertically to press the wafer 101 against the probe card 300 to electrically connect the wafer 101 and the probe card 300. However, the method for connecting the wafer 101 and the probe card 300 is not limited to this. For example, this connection can be achieved by an alignment stage 410 that holds the wafer 101 and that extends and contracts horizontally to press the wafer 101 against the probe card 300 that is held vertically.

Figure 3:
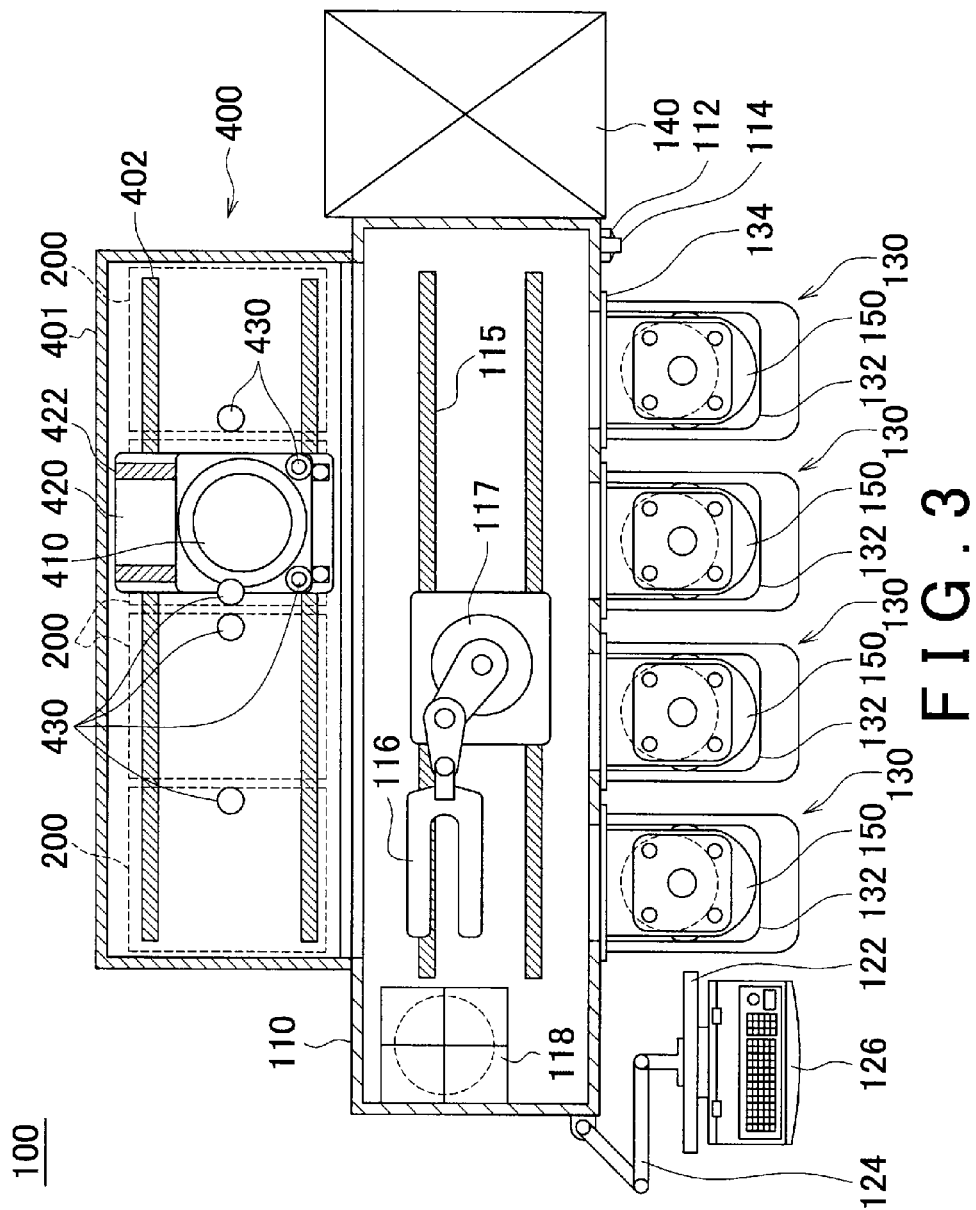
FIG. 3 shows a partial horizontal cross section of the test apparatus 100.

FIG. 3 is a schematic view of a partial horizontal cross section of the test apparatus 100. Components that are the same as those in FIGS. 1 and 2 are given the same reference numerals and redundant descriptions are omitted. In the present embodiment, the test apparatus 100 includes four load units 130 and four test heads 200. Each load unit 130 has a FOUP 150 loaded thereon. One EFEM 110 and one alignment unit 400 are provided. The alignment unit 400 includes a single alignment stage 410. In the present embodiment, the test apparatus 100 includes a plurality of probe cards 300 corresponding respectively to the test heads 200.

In the EFEM 110, the column 117 supporting the robotic arm 116 moves across substantially the entire width of the EFEM 110 along the rail 115. Accordingly, the robotic arm 116 can transport the wafer 101 to all of the four load units 130 and the four test heads.

A pre-aligner 118 is arranged within the EFEM 110 on a side opposite the cooling unit 140. The pre-aligner 118 adjusts the loading position of the wafer 101 relative to the robotic arm 116, with an accuracy that is less than that required for the test head 200 but still relatively high. As a result, the initial positioning accuracy when the robotic arm 116 loads the wafer 101 onto the wafer tray 450 is improved, and the time necessary for alignment with the probe card 300 is decreased. Furthermore, the throughput of the test apparatus 100 is increased.

The alignment unit 400 includes a rail 402, the alignment stage 410, a rail 422, a stage carrier 420, and microscopes 430. The rail 402 is arranged across substantially the entire width of the bottom surface of a chassis 401.

The stage carrier 420 moves along the rail 402 in a longitudinal direction of the chassis 401. The stage carrier 420 includes a rail 422 on the top surface thereof that runs parallel to the rail 402. The stage carrier 420 has a portion of the microscopes 430 and the alignment stage 410 loaded thereon. This portion of the microscopes 430 and the alignment stage 410 move above the rail 422 in the direction of the shorter dimension of the chassis 401.

In the present embodiment a pair of microscopes 430 are loaded on the stage carrier 420. The pair of microscopes 430 are arranged to be separated from each other in a direction in which the rail 402 extends. As a result, the movement amount of the stage carrier 420 when capturing an image of the wafer 101 and the probe card 300 can be reduced. The pair of microscopes 430 are arranged to face upward. The pair of microscopes 430 capture an image of the probe card 300 to acquire information relating to the position and shapes of bumps on the surface of the probe card 300.

Other microscopes 430 are arranged on the ceiling of the chassis 401. These microscopes 430 are arranged to face downward. These microscopes 430 correspond to the test heads 200 and are arranged near corresponding probe cards 300. These microscopes 430 capture images of the wafer 101 loaded on the alignment stage 410 to acquire information relating to the position and shape of the test pads on the surface of the wafer 101. When a device formed on the wafer 101 is being tested, the test pads form electrical connection points that are used for supplying power or inputting a signal to the device. The test pads are examples of first terminals.

The accuracy for the alignment of the probe card 300 and the wafer 101 achieved by using the image data captured by the microscopes 430 is greater than the accuracy of the pre-aligner 118. For example, the position of the wafer 101 can be detected by analyzing the image data captured by the microscopes 430 and detecting the edge of the wafer 101 or the alignment mark provided on the wafer 101. The relative positions of the probe card 300 and the microscopes 430 on the ceiling of the chassis 401 are already known.

Therefore, the wafer 101 and the probe card 300 can be aligned by calculating the difference between the detected position of the wafer 101 and the position of the probe card 300 and moving the alignment stage 410 to compensate for this difference. The method for aligning the wafer 101 and the probe card 300 is not limited to this. For example, an image from the microscopes 430 may be displayed on the display 122, and the wafer 101 and probe card 300 may be aligned manually.

In the present embodiment, the wafer 101 and the probe card 300 are aligned by using position information acquired by the microscopes 430 to achieve more favorable contact between the terminals on the surface of the wafer 101 and the terminal on the surface of the probe card 300. As a result, the terminals on the surface of the wafer 101 and the terminals on the surface of the probe card 300 can achieve more stable contact with each other.

The microscopes 430 are examples of image capturing sections that capture an image of at least one of a surface of the wafer 101 and a surface of the probe card 300. The microscopes 430 are also examples of position information acquiring sections that acquire position information concerning the terminals on the surface of the wafer 101 and position information concerning the terminals on the surface of the probe card 300.

In the present Specification, the "position information" concerning the terminals on the surface of the wafer 101 indicates the shape and relative position of each terminal of the wafer 101. Similarly, the "position information" concerning the terminals on the surface of the probe card 300 indicates the shape and relative position of each terminal of the probe card 300.

In the present embodiment, position information for all of the terminals is acquired by capturing images of the wafer 101 and the probe card 300, but the function of the position information acquiring section is not limited to this. For example, position information may be acquired that relates only to terminals with important functions or terminals that are important for improving alignment accuracy from among the terminals on the surfaces of the device under test and the probe card. Terminals with important functions may include terminals for supplying power and terminals that handle high-frequency signals, for example. Terminals that are important for improving alignment accuracy may include terminals that form an outline of a prescribed shape corresponding to the shape of a plurality of terminals gathered together, for example.

Figure 4:
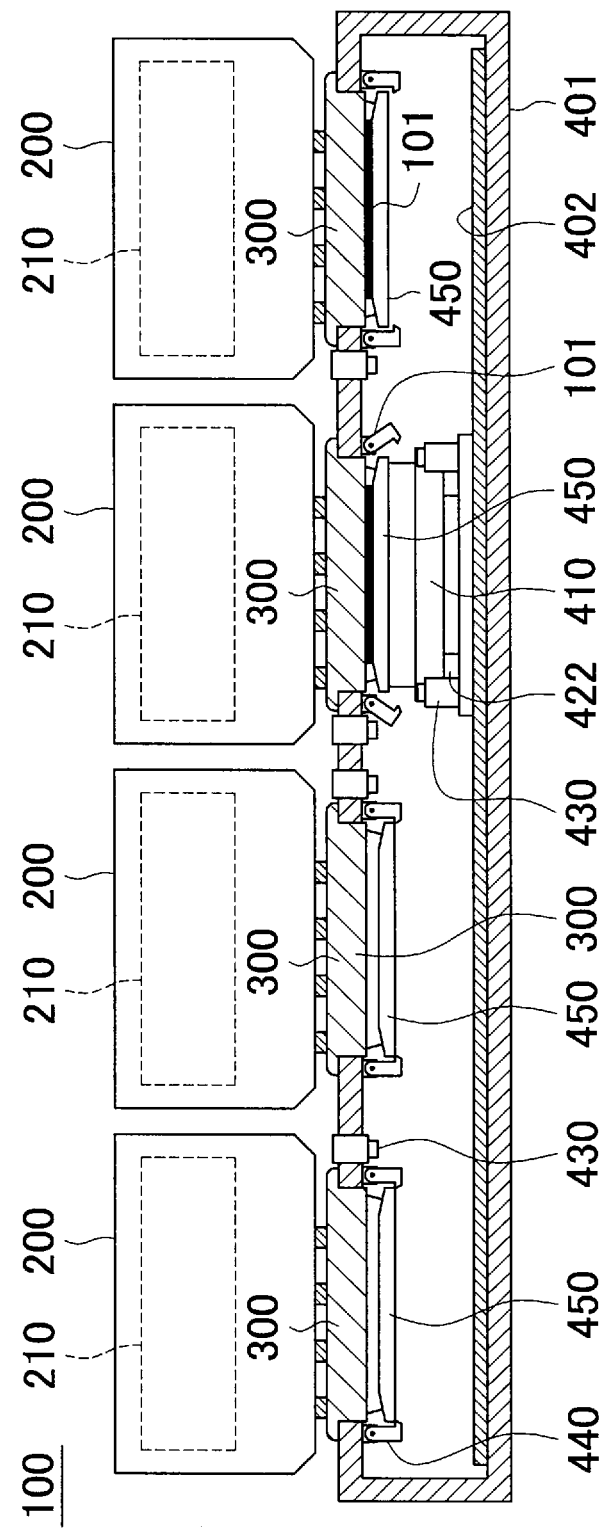
FIG. 4 shows a partial vertical cross section of the alignment unit 400.

FIG. 4 is a schematic view of a partial vertical cross section of the alignment unit 400. Components that are the same as those in FIGS. 1 to 3 are given the same reference numerals and redundant descriptions are omitted, and the mainframe 160 is not shown in FIG. 4. As shown in FIG. 4, the alignment unit 400 includes the chassis 401, the alignment stage 410, and a hanger hook 440.

The chassis 401 has a width according to a plurality of test heads 200, in this case four test heads 200. Four probe cards 300 corresponding respectively to the test heads 200 are mounted on the top surface of the chassis 401. Furthermore, hanger hooks 440 that open and close are arranged on the ceiling within the chassis 401 at positions corresponding respectively to the test heads 200.

When the hanger hooks 440 are closed, the wafer trays 450 hang thereon to be held immediately below the probe cards 300. Therefore, the alignment unit 400 can have a wafer tray 450 waiting immediately below each set of a test head 200 and a probe card 300. When the hanger hooks 440 open, the wafer trays 450 are released.

In the alignment unit 400, each wafer tray 450 held by hanger hooks 440 is loaded onto the alignment stage 410 that rises up from below. Next, the hanger hooks 440 open and the alignment stage 410 drops, thereby releasing the wafer tray 450 from the hanger hooks 440.

Next, the robotic arm 116 of the EFEM 110 loads the wafer 101 onto the wafer tray 450 whose top surface was released by the drop of the alignment stage 410. In this way, the alignment stage 410 can have the wafer 101, which is placed on the wafer tray 450, loaded thereon.

Next, the alignment stage 410 aligns the wafer 101 with the probe card 300 while raising the wafer tray 450, thereby pressing the wafer 101 against the bottom surface of the probe card 300. In this state, the probe card 300, the wafer 101, and the wafer tray 450 are formed integrally.

For example, the probe card 300, the wafer 101, and the wafer tray 450 can be formed integrally by sandwiching the wafer 101 between the probe card 300 and the wafer tray 450 and reducing pressure between the probe card 300 and the wafer tray 450. Another possible method involves using a fixing jig to sandwich the probe card 300 and the wafer tray 450 from the outside while the wafer 101 is therebetween.

After this, the alignment stage 410 moves while leaving behind the wafer 101 and the wafer tray 450. Since the probe card 300, the wafer 101, and the wafer tray 450 are formed integrally, the wafer 101 and the wafer tray 450 do not fall even though the alignment stage 410 is no longer there.

As a result, the wafer 101 can be mounted on the test head 200. While this test head 200 tests the wafer 101, the alignment stage 410 can transport another wafer 101 to another test head 200. If the wafers 101 are to be collected after testing is finished, the series of operations described above are then performed in reverse. As a result, the wafer 101 can be transported by the robotic arm 116. At this time, the wafer tray 450 waits immediately below the test head 200.

In the example of FIG. 4, in the test head 200 on the right end, the wafer tray 450 and the wafer 101 are formed integrally with the probe card 300 immediately below the test head 200. At this time, the hanger hooks 440 are closed, but do not contact the wafer tray 450. Furthermore, immediately below the test head 200 that is second from the right in FIG. 4, the alignment stage 410 is pushing up on the wafer tray 450 and the wafer 101 loaded thereon to attach the wafer 101 to the probe card 300. Under the other test heads 200, the hanger hooks 440 are holding the wafer trays 450 in a waiting position.

In this way, wafer trays 450 corresponding respectively to four test heads 200 are loaded in the alignment unit 400. As a result, each test head 200 can individually test a wafer 101. The plurality of test heads 200 may perform the same type of test, or may each perform a different test. If the test heads 200 perform different tests, the throughput of the test apparatus 100 can be improved by allocating a test that requires a large amount of time to a plurality of test heads 200.

In this way, in the test apparatus 100, a single alignment stage 410 and a single robotic arm 116 can be shared by a plurality of test heads 200. As a result, the usage efficiency of the alignment stage 410 and the robotic arm 116, which are unnecessary during the actual testing, can be improved.

Figure 5:
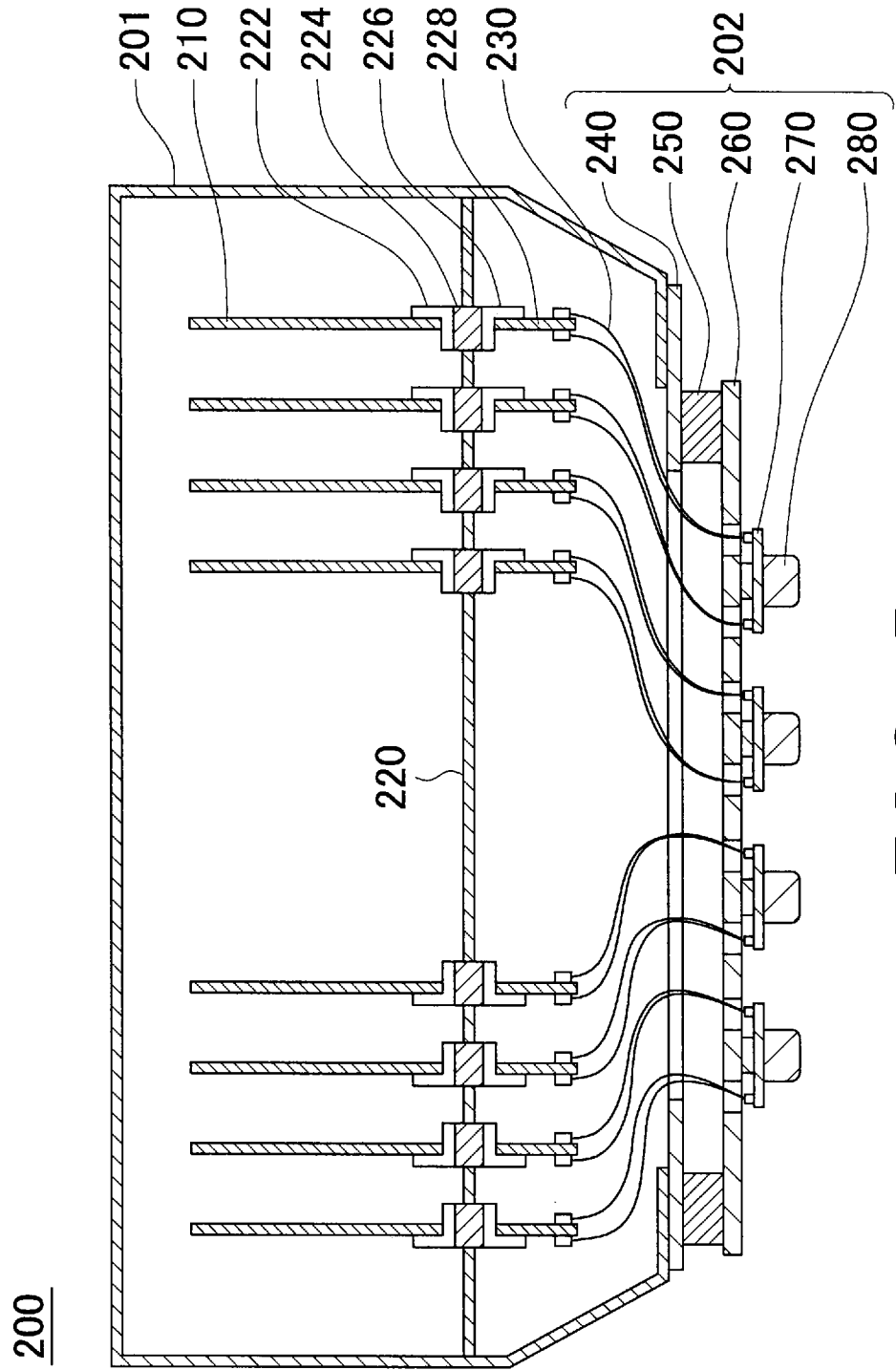
FIG. 5 shows a cross section of a test head 200.

FIG. 5 is a schematic view of a cross section of a test head 200. Components that are the same as those in FIGS. 1 to 4 are given the same reference numerals and redundant descriptions are omitted. The test head 200 includes a chassis 201, a contactor 202, pin electronics 210, a motherboard 220, and flat cables 230.

The motherboard 220 includes a plurality of relay connectors 224 and is oriented horizontally within the chassis 201. The relay connectors 224 each include receptacles on the top surface side and the bottom surface side of the motherboard 220, and form signal paths passing through the motherboard 220.

On the top surface of the motherboard 220, the pin electronics 210 are mounted on the relay connectors 224 via angle connectors 222. With this configuration, the pin electronics 210 can be replaced according to the testing content and the specifications of the test target.

The pin electronics 210 may have the same specifications as each other or may have different specifications. Furthermore, pin electronics 210 need not be mounted on some of the relay connectors 224.

On the bottom surface of the motherboard 220, small substrates 228 are connected to the relay connectors 224 via angle connectors 226. One end of each flat cable 230 is connected to a corresponding small substrate 228. As a result, the pin electronics 210 inside the chassis 201 and the contactor 202, described further below, can be connected to each other via the flat cables 230.

The contactor 202 is mounted on the bottom surface of the chassis 201. The contactor 202 includes a support substrate 240, three-dimensional actuators 250, a contactor substrate 260, sub-substrates 270, and contactor housings 280.

The top surface of the support substrate 240 is fixed to the chassis 201, and the bottom surface of the support substrate 240 supports top ends of the three-dimensional actuators 250. The bottom ends of the three-dimensional actuators 250 support the contactor substrate 260. The sub-substrates 270 and the contactor housings 280 are fixed on the bottom surface of the contactor substrate 260.

The three-dimensional actuators 250 extend and contract vertically, and can move horizontally along the bottom surface of the support substrate 240. As a result, the contactor substrate 260 can move three-dimensionally. When the contactor substrate 260 moves, the sub-substrates 270 and the contactor housings 280 move along with the contactor substrate 260.

The bottom ends of the flat cables 230 are connected to terminals held by the contactor housings 280, such as spring pins. As a result, the pin electronics 210 are electrically connected down to the bottommost surface of the test head 200. Spring pins are given as an example of the terminals here, but configurations that use capacitance coupling or optical coupling, for example, may be adopted instead of using the spring pins.

Figure 6:
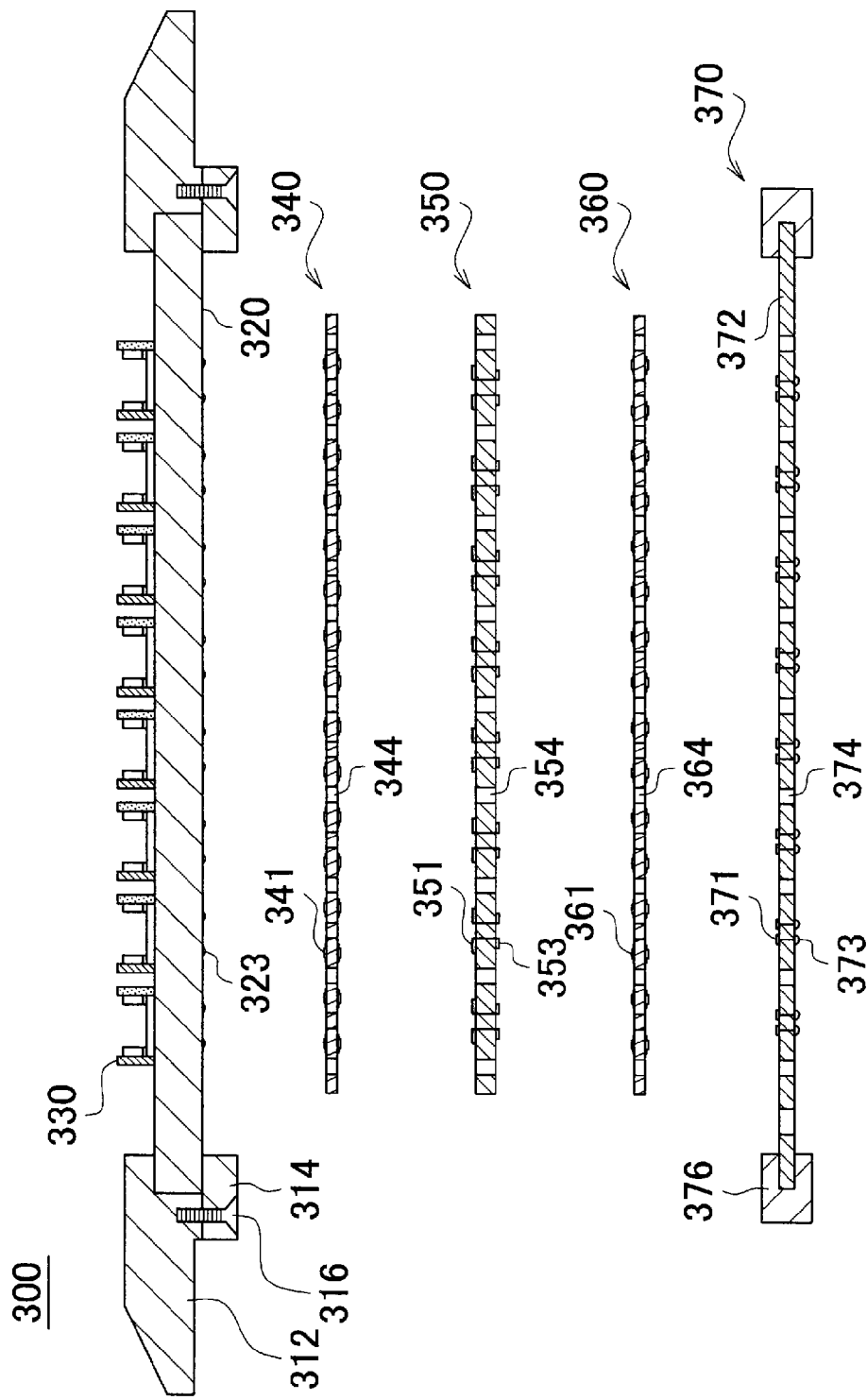
FIG. 6 shows an exploded view of the probe card 300.

FIG. 6 is a schematic exploded view of the probe card 300. The probe card 300 includes a circuit board 320, a PCR sheet 340, an interposer 350, a PCR sheet 360, and a membrane unit 370.

The circuit board 320 may be formed by an insulating substrate with relatively high mechanical strength, such as a polyimide substrate. The circumferential edge of the circuit board 320 is sandwiched between an upper frame 312 and a lower frame 314. The upper frame 312 and the lower frame 314 are layered on each other and connected by screws 316. As a result, the mechanical strength of the circuit board 320 is further increased.

A plurality of guide units 330 are arranged on the top surface of the circuit board 320. When the contactor 202 contacts the circuit board 320, the guide units 330 function as connector guides that guide the contactor 202 to a determined position. A plurality of contact pads 323 are arranged on the bottom surface of the circuit board 320 to achieve an electrical connection via contact. The contact pads 323 are electrically connected to contact pads, not shown, that are arranged on the inner sides of the guide units 330 on the top surface of the circuit board 320.

The PCR sheet 340 includes through-electrodes 341 that pass therethrough from top to bottom. The through-electrodes 341 of the PCR sheet 340 have the same layout as the contact pads 323 on the bottom surface of the circuit board 320. As a result, when the circuit board 320 and the PCR sheet 340 are layered, the contact pads 323 and the through-electrodes 341 are electrically connected to each other.

The interposer 350 includes contact pads 351 and contact pads 353 respectively on the top surface and bottom surface thereof. The contact pads 351 on the top surface have the same layout as the through-electrodes 341 of the PCR sheet 340. Therefore, when the PCR sheet 340 and the interposer 350 are layered, the contact pads 351 and the through-electrodes 341 are electrically connected to each other.

The contact pads 353 on the bottom surface correspond respectively to the contact pads 351 on the top surface, and are electrically connected thereto. The contact pads 353 on the bottom surface may have a different layout than the contact pads 351 on the top surface. In other words, the contact pads 351 and the contact pads 353 may have different pitches.

By using the interposer 350, even when the contact pads 353 on the bottom surface of the interposer 350 match the test pads of the wafer 101, the contact pads 351 on the top surface of the interposer 350 can have any layout. The test pads of the wafer 101 are formed on an integrated circuit, and so the test pads have a small testing surface area and the pitch between pads is also small. However, by using the interposer 350, the pitch of the contact pads 351 can be greater than the pitch of the contact pads 353. Furthermore, by using the interposer 350, the surface area of the contact pads 351 can be greater than the surface area of the contact pads 353. As a result, the connection between the contactor 202 and the probe card 300 is simpler and more reliable.

The PCR sheet 360 includes through-electrodes 361 that pass therethrough from front to back. The through-electrodes 361 of the PCR sheet 360 have the same layout as the contact pads 353 on the bottom surface of the interposer 350. As a result, when the interposer 350 and the PCR sheet 360 are layered, the contact pads 353 and the through-electrodes 361 are electrically connected to each other.

The membrane unit 370 includes contact pads 371, an elastic sheet 372, bumps 373, and a frame 376. The elastic sheet 372 is formed by an elastic insulating material. The elastic sheet 372 may be a polyimide film. The frame 376 grips the circumferential edge of the elastic sheet 372 to support the elastic sheet 372 in a level state. The frame 376 may be formed of a material that has a thermal expansion coefficient that is substantially equal to that of the wafer 101.

The contact pads 371 are arranged on the top surface of the elastic sheet 372 with the same layout as the through-electrodes 361 on the bottom surface of the PCR sheet 360. Accordingly, when the PCR sheet 340 and the membrane sheet 370 are layered, the through-electrodes 361 and the contact pad 371 are electrically connected to each other.

The bumps 373 are arranged on the bottom surface of the elastic sheet 372. The bumps 373 function as connection terminals for connecting the wafer 101 to the bottommost surface of the probe card 300. The bumps 373 are examples of second terminals.

When aligning the wafer 101 and the probe card 300, the bumps 373 can be used as alignment marks. The bumps 373 functioning as the connection terminals for the wafer 101 can be used as alignment marks and, in addition to these bumps 373, other bumps 373 may be formed to be used as alignment marks. The layout of the bumps 373 functioning as the connection terminals for the wafer 101 may be the same as the layout of the test pads on the wafer 101. The bumps 373 used as alignment marks may be formed in the same manner as the bumps 373 for electrically connecting to the test pads.

The PCR sheet 340, the interposer 350, the PCR sheet 360, and the membrane unit 370 respectively include through-holes 344, 354, 364, and 374, which pass therethrough from top to bottom. When the PCR sheet 340, the interposer 350, the PCR sheet 360, and the membrane unit 370 are layered, these through-holes are arranged in a manner to be continuous with each other. As a result, exhaust between each component is facilitated.

Figure 7:
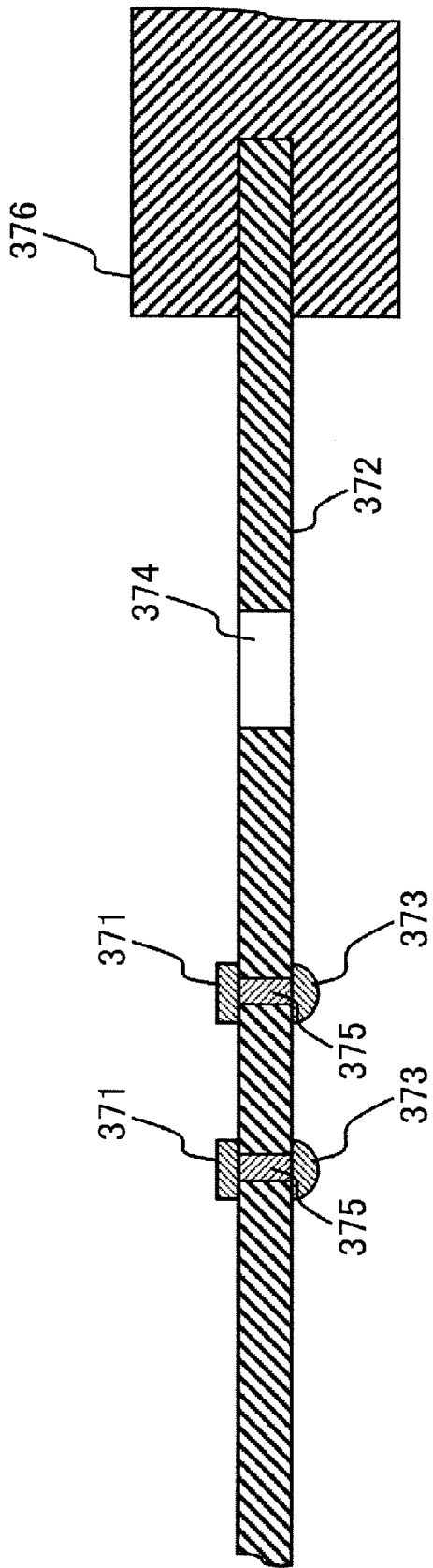
FIG. 7 shows a partial expanded cross section of the membrane unit 370.

FIG. 7 is a schematic view of a partial expanded cross section of the membrane unit 370. The membrane unit 370 includes contact pads 371, the elastic sheet 372, bumps 373, a through-hole 374, and the frame 376. Each bump 373 has a central portion that protrudes downward. As a result, the bumps 373 function as connection terminals for the wafer 101 on the bottommost surface of the probe card 300.

Each bump 373 is electrically connected to a corresponding contact pad 371 via a through-electrode 375 formed in a through-hole in the elastic sheet 372. The contact pads 371 have the same layout as the contact pads 353 on the bottom surface of the interposer 350 and the through-electrodes 361 of the PCR sheet 360. As a result, when the membrane unit 370, the PCR sheet 360, and the interposer 350 are layered, an electrical connection is formed from the bumps 373 to the interposer 350.

Figure 8:
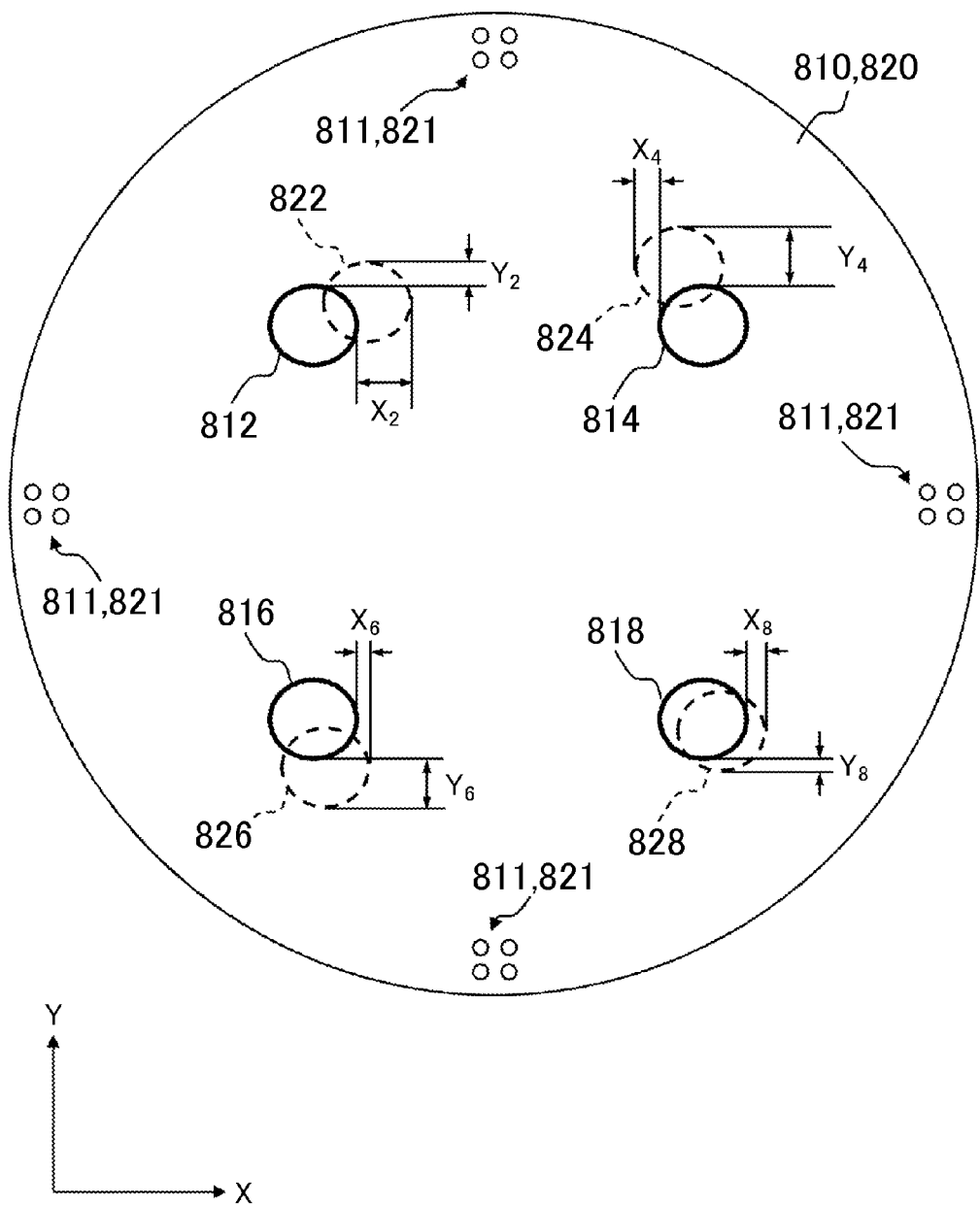
FIG. 8 shows a planar view of a wafer 810 and a probe card 820.

FIG. 8 is a schematic planar view of a wafer 810 and a probe card 820. FIG. 8 shows a state in which the wafer 810 and the probe card 820 are aligned in a manner such that alignment marks 811 and alignment marks 821 match. In FIG. 8, the X direction and the Y direction indicate directions that are parallel to the surface of the wafer 810 and orthogonal to each other. Furthermore, the positive X direction is toward the right side of FIG. 8 and the positive Y direction is toward the top of FIG. 8.

The following uses FIG. 8 to describe displacement in the relative positions of the test pads and corresponding bumps acquired by the microscopes 430, with respect to the intended relative positions according to the design. For ease of explanation, the probe card 820 in the following description includes four bumps and the wafer 810 includes four test pads.

The wafer 810 has the same configuration as the wafer 101. The wafer 810 includes a test pad 812, a test pad 814, a test pad 816, a test pad 818, and alignment marks 811. In the present embodiment, the alignment marks 811 are each formed by four bumps. The alignment marks 811 are arranged at uniform intervals on the circumferential edge of the wafer 810.

The probe card 820 has the same configuration as the probe card 300. The probe card 820 includes a bump 822, a bump 824, a bump 826, a bump 828, and alignment marks 821. Each bump has the same configuration as the bump 373. In the present embodiment, each alignment mark 821 is formed as four bumps. The alignment marks 821 are arranged at uniform intervals on the circumferential edge of the probe card 820. The dotted lines in FIG. 8 indicate the outlines of bumps when the bumps are projected onto the top of the wafer 810.

The test pads and corresponding bumps are designed to have sufficient contact therebetween when aligning the wafer 810 and the probe card 820 such that the alignment marks 811 and the alignment marks 821 match each other. In many cases, however, misalignment occurs between the test pads and the bumps even when the wafer 810 and the probe card 820 are aligned such that alignment marks 811 and the alignment marks 821 match, due to manufacturing errors in the test pads or the bumps or to differences in the thermal expansions coefficients of the wafer 810 and the probe card 820, for example.

In other words, manufacturing errors or the like cause the relative positions of the test pads and the corresponding bumps to be displaced from their intended relative positions according to the design. When this misalignment or displacement amount is large, the contact between the test pads and the bumps worsens, thereby affecting the stability of the testing. In the present Specification, the "displacement amount" between the test pads and corresponding bumps refers to the amount of displacement of the relative positions of the test pads and the corresponding bumps with respect to the relative positions thereof according to the design. For example, in the case of a design where the center of each test pad is supposed to match the center of the corresponding bump, this "displacement amount" can be calculated by measuring the distance between the center of a test pad and the center of the corresponding bump.

The following uses FIG. 8 to describe a method for calculating the "displacement amount" between the test pads and the corresponding bumps. For ease of explanation, FIG. 8 is used to describe a case in which the test pads and the corresponding bumps in the wafer 810 and the probe card 820 have the same shape, and the test pads and corresponding bumps are designed to having matching centers when the alignment mark is used to align the wafer 810 and the probe card 820.

The relative position of the bump 822 with respect to the test pad 812 is displaced by $X_2$ in the positive X direction and by $Y_2$ in the positive Y direction, compared to the relative positions according to the design. Similarly, the relative position of the bump 824 with respect to the test pad 814 is displaced by $X_4$ in the negative X direction and by $Y_4$ in the positive Y direction. The relative position of the bump 826 with respect to the test pad 816 is displaced by $X_6$ in the positive X direction and by $Y_6$ in the negative Y direction. The relative position of the bump 828 with respect to the test pad 818 is displaced by $X_8$ in the positive X direction and by $Y_8$ in the negative Y direction. The displacement amounts between the test pads on the wafer 101 and the bumps on the probe card 300 can be calculated in the same way.

Figure 9:
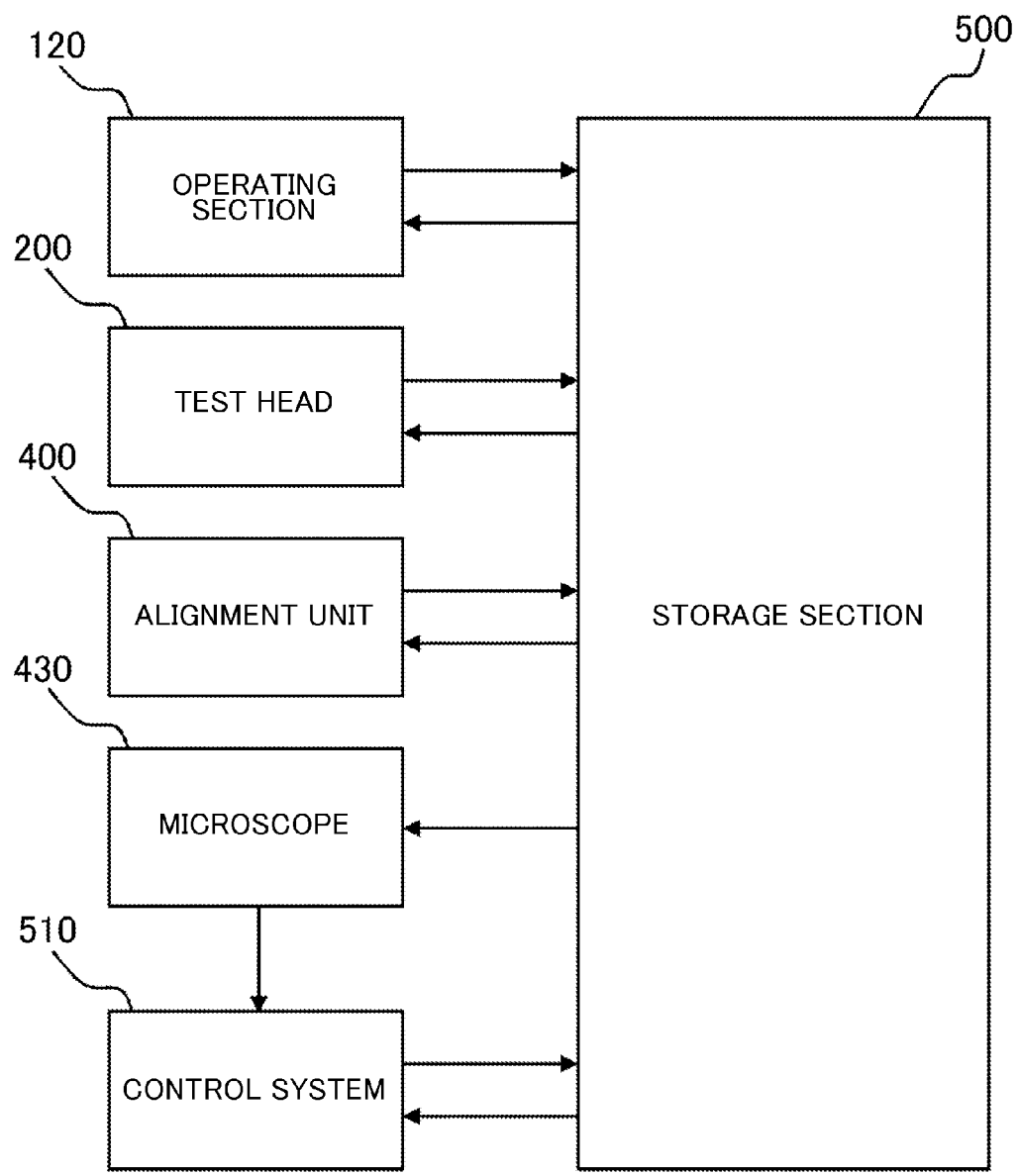
FIG. 9 shows an exemplary system configuration of the control system 500.

FIG. 9 is a schematic view of an exemplary system configuration of the control system 500. The control system 500 includes an operating section 120, a test head 200, an alignment unit 400, a microscope 430, and a storage section 510. In the present embodiment, the microscope 430 is connected to the storage section 510.

The control system 500 receives from the operating section 120 information relating to settings, operations, etc. of the test apparatus 100. The control system 500 may receive setting values used when searching for optimal values for the relative positions of the wafer 101 and the probe card 300. The control system 500 may receive position information concerning a plurality of test pads on the surface of the wafer 101 and position information concerning a plurality of bumps on the surface of the probe card 300. The control system 500 notifies the operating section 120 concerning information relating to testing and information relating to the operational state of the test apparatus 100.

The setting values used when searching for the optimal values for the relative positions of the wafer 101 and the probe card 300 may be (i) a maximum value allowed by the used for the displacement amount between the test pads and the bumps, (ii) a value that, when a test result indicates that the wafer 101 is defective, serves as a reference for determining the source of this defect, (iii) a displacement amount occurring each time a change is made when searching for optimal values for relative positions while changing the relative positions, or (iv) a maximum value for this displacement amount.

The control system 500 searches for the optimal values for the relative positions of the wafer 101 and the probe card 300. The control system 500 determines the relative positions of the wafer 101 and the probe card 300 based on the position information concerning a plurality of test pads on the surface of the wafer 101 and the position information concerning a plurality of bumps on the surface of the probe card 300. The control system 500 may calculate the displacement amount for each test pad and the corresponding bump and determine the relative positions of the wafer 101 and the probe card 300 such that the maximum value for each displacement value is less than a predetermined value.

The control system 500 may notify the storage section 510 concerning the displacement amount for the determined relative positions in association with each bump. The storage section 510 stores the information received from the control system 500. The storage section 510 is an example of a second storage section. The control system 500 may notify the storage section 510 concerning the displacement amount for the determined relative positions in association with each test pad on the surface of the wafer 101.

The control system 500 receives from the test head 200 information relating to the test results of the wafer 101. The control system 500 controls the test head 200 according to a test program. For example, the control system 500 may notify the test head 200 concerning information relating to the progress of the test and testing data.

The control system 500 may judge the acceptability of each of a plurality of chips on the wafer 101, which is an example of a device under test, based on the test results of the wafer 101 received from the test head. The control system 500 may notify the storage section 510 concerning acceptability information for the chips on the wafer 101 in association with each bump on the surface of the probe card. The storage section 510 may store the information received from the control system 500. The storage section 510 is an example of a second storage section. The control system 500 may notify the storage section 510 concerning acceptability information for the plurality of chips on the wafer 101 in association with each test pad on the surface of the wafer 101.

The control system 500 notifies the alignment unit 400 concerning information relating to transport of the wafer 101 and information relating to the alignment of the wafer 101 and the probe card 300, for example. The alignment unit 400 transports the wafer 101 to the appropriate test head 200, aligns the wafer 101 with the probe card 300, and integrally forms the wafer 101 and the probe card 300 according to the information from the control system 500. The control system 500 receives from the alignment unit 400 information concerning the current state of the wafer 101.

The control system 500 instructs the microscope 430 to capture an image of the wafer 101 and the probe card 300. The microscope 430 captures an image of the wafer 101 and the probe card 300 based on the instructions from the control system 500, thereby acquiring position information concerning the test pads on the surface of the wafer 101 and position information concerning the bumps on the surface of the probe card 300. The microscope 430 notifies the storage section 510 concerning the acquired position information. The storage section 510 stores the position information received from the microscope 430.

The control system 500 receives the information stored in the storage section 510 from the storage section 510. The control system 500 notifies the storage section 510 concerning the information received from the operating section 120, the test head 200, and the alignment unit 400. When the control system 500 receives the information via a communication line, the control system 500 notifies the storage section 510 concerning this information. The storage section 510 stores the information received from the control system 500.

The following describes the control of the test apparatus 100 by the control system 500. The control system 500 receives from the storage section 510 the position information concerning the test pads on the surface of the wafer 101 and the position information concerning the bumps on the surface of the probe card 300 and, based on the setting value received from the operating section 120, searches for optimal values for the relative positions of the wafer 101 and the probe card 300, and sets these relative positions.

For example, the control system 500 may calculate, for each test pad, the displacement amount of the corresponding bump, based on the position information concerning the test pads and the position information concerning the bumps. The control system 500 then determines the relative positions of the wafer 101 and the probe card 300 such that the maximum value among the calculated displacement amounts is less than a predetermined value. This predetermined value may be a value allowed by the user and received from the operating section 120. If the maximum value of the calculated displacement amounts cannot be made smaller than the predetermined value, the control system 500 may notify the operating section 120 of this fact and the operating section 120 may display this information on the display 122.

Next, the control system 500 controls the alignment unit 400, based on the determined relative positions, to align the wafer 101 and the probe card 300. After this, the control system 500 controls the test head 200 to test the wafer 101. The control system 500 receives test results of the wafer 101 from the test head 200.

When the control system 500 judges that the wafer 101 is defective according to the above test, the control system 500 may also analyze the cause of this defect. This analysis can be performed in the manner described below, for example. The control system 500 is an example of an analyzing section.

Each time a test is performed, the control system 500 calculates the displacement amount between each bump and the corresponding test pad in an aligned state, based on the position information concerning the test pads and the position information concerning the bumps. The control system 500 stores the displacement amount in the aligned state in the storage section 510, for each bump of the probe card 300. Each time a test is performed, the control system 500 stores the test results in association with each bump in the storage section 510.

When the wafer 101 is judged to be defective according to the test, the control system 500 determines that the problem is in the wafer 101 or the probe card 300 if the displacement amount of the defective location is less than a prescribed value. Furthermore, regardless of the test target, when a defect occurs while using a certain bump, the problem is determined to be in the probe card 300. On the other hand, when the displacement amount of the defective location is greater than the prescribed value, the problem is determined to be in the connection between the wafer 101 and the probe card 300. The control system 500 may receive the prescribed value from the operating section 120.

In the present embodiment, the test apparatus 100 includes a plurality of probe cards 300. Furthermore, the test apparatus 100 includes a plurality of test heads 200 for testing the device under test, and the test heads 200 correspond respectively to the probe cards 300. Each probe card 300 electrically connects the device under test to the corresponding test head 200. In this case, the control system 500 may control the test apparatus 100 in the manner described below.

First, the control system 500 controls the alignment unit 400 and the microscope 430 to acquire position information concerning the bumps on the surface of each probe card 300. The control system 500 also controls the alignment unit 400 and the microscope 430 to acquire position information concerning the test pads on the surface of the wafer 101. The control system 500 may acquire at least one of the position information concerning the bumps and the position information concerning the test pads from the operating section 120 or from a communication line.

Next, the control system 500 searches for the optimal values for the relative positions of the wafer 101 and each probe card 300, based on the position information concerning the bumps of each probe card 300 and the position information concerning the test pads, and sets these relative positions. For example, the control system 500 sets the relative positions such that the maximum value of the displacement amounts of the test pads and corresponding bumps in each probe card 300 is less than a predetermined value. The control system 500 then calculates the maximum value of the displacement amounts between the test pads and the bumps for the relative positions for each probe card 300.

The control system 500 selects which probe card 300 to use for testing. At this time, the control system 500 selects one of the probe cards 300 based on the maximum value of the displacement amounts. For example, the control system 500 may select the probe card 300 having the smallest displacement amount maximum value. If the probe card 300 having the smallest displacement amount maximum value is being used for testing, the control system 500 may select the probe card 300 having the second smallest displacement amount maximum value.

Next, the control system 500 controls the alignment unit 400 and transports the wafer 101 immediately below the selected probe card 300 to align the wafer 101 with the probe card 300. The control system 500 notifies the alignment unit 400 about information concerning the relative position of the wafer 101 determined for the selected probe card 300. The alignment unit 400 adjusts the relative positions of the wafer 101 and the selected probe card 300 based on a signal from the control system 500, and electrically connects the wafer 101 to the selected probe card 300.

As a result, more stable testing can be achieved. The present embodiment describes an example in which the test heads 200 and the probe cards 300 correspond one-to-one, but the present invention is not limited to this. For example, the test apparatus 100 may include a plurality of probe cards 300 for a single test head 200.

The control system 500 may be realized using hardware or software. The control system 500 may be a system that is specialized for testing a device under test, or may be a general information processing apparatus such as a personal computer. For example, the control system 500 can be realized by executing software that defines the operation of each component of the test apparatus 100 using an information processing apparatus that includes an input apparatus, an output apparatus, a storage apparatus, and data processing apparatuses such as a CPU, a ROM, a RAM, and a communication interface.

The control system 500 may be provided by a program that controls an information processing apparatus as described above to realize the control system 500, or by a recording apparatus on which this program is recorded. The recording medium may be a magnetic recording medium such as a floppy Disk® or a hard disk, an optical recording medium such as a CD-ROM, a magneto-optical recording medium such as an MD, or a semiconductor memory such as an IC card. As another example, the storage medium may be a storage apparatus such as a RAM or a hard disk provided to a server system connected to the internet or a dedicated communication network, and the program may be supplied to the information processing apparatus via the network. The specialized system and information processing apparatus described above may be formed by a signal computer, or may be formed by a plurality of computers in a network.

The program is read from the recording medium by the information processing apparatus to control operation of the information processing apparatus. For example, the information processing apparatus may be controlled by the program to perform (i) a process that involves acquiring, from the test apparatus 100, position information concerning a plurality of first terminals on the surface of the device under test and position information concerning a plurality of second terminals on the surface of the probe card used to test the device under test and (ii) a process that involves calculating the displacement amount between each first terminal and the corresponding second terminal, based on the position information concerning the first terminals and the position information concerning the second terminals, and aligning the device under test and the probe card such that the maximum value among the displacement amounts becomes less than a predetermined value. In this way, the information processing apparatus can perform the same processes as the control system 500 shown in FIG. 9.

The present embodiment describes an example in which the control system 500 provided in the mainframe 160 controls the operating section 120, the test head 200, the alignment unit 400, the microscope 430, and the storage section 510. However, the configuration of the control system 500 is not limited to this. For example, a portion of the functions of the control system 500 may be performed by components of the test apparatus 100. Furthermore, the control system 500 may include the function of the position information acquiring section.

Figure 10:
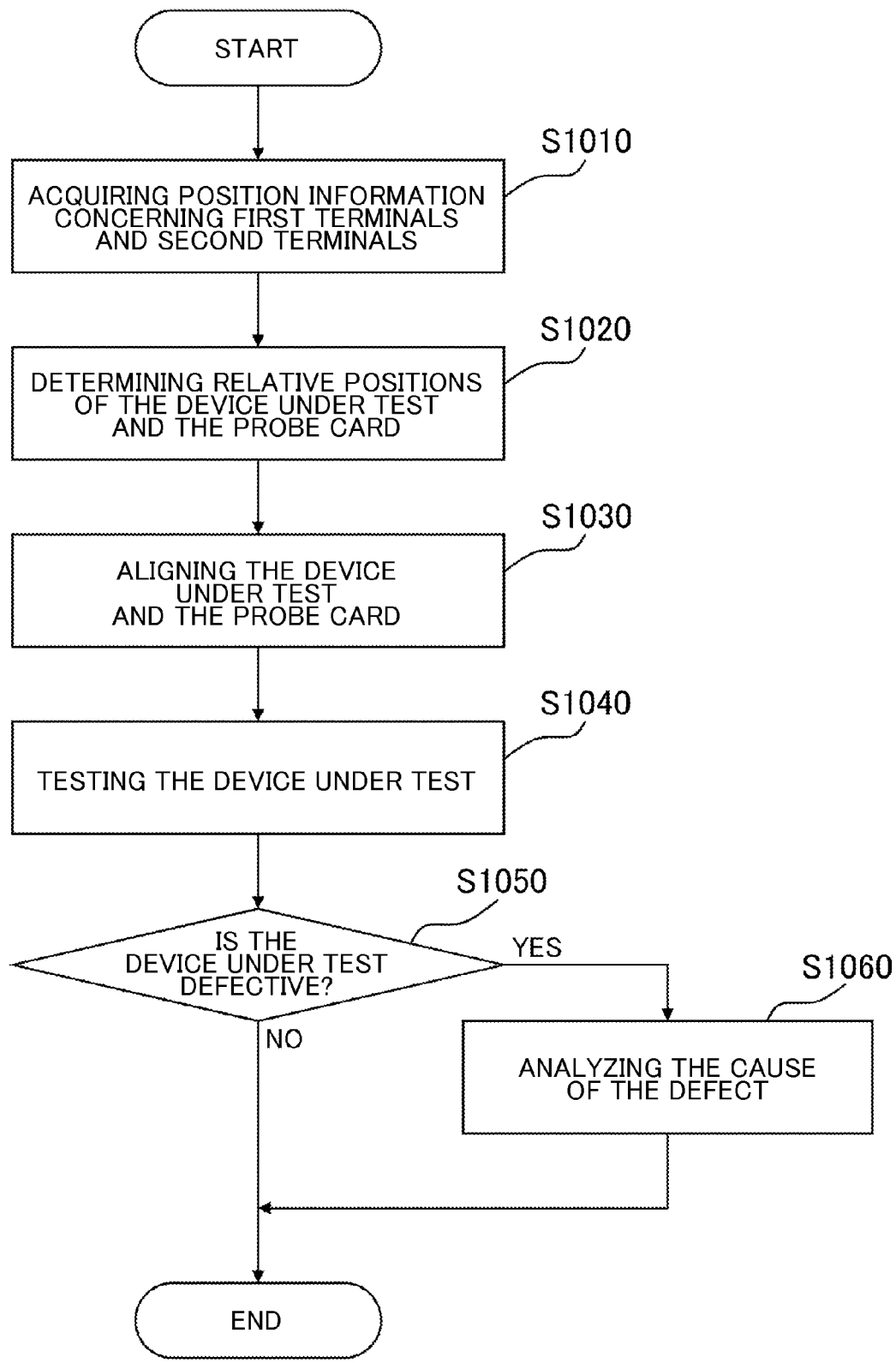
FIG. 10 is a flow chart of a testing method performed by the test apparatus 100.

FIG. 10 is a flow chart of a testing method performed by the test apparatus 100. For ease of explanation, the following describes a testing method and alignment method performed by the test apparatus 100 on the wafer 810 and the probe card 820 shown in FIG. 8.

First, at step S1010, the test apparatus 100 acquires the position information concerning the test pads on the surface of the wafer 810 and the position information concerning the bumps on the surface of the probe card 820. The position information may be acquired by using the microscope 430 to capture images of the wafer 810 and the probe card 820. In this case, the position information can be acquired from actual images, and so the effect of temperature on the displacement can be known. The position information may instead be acquired from the operating section 120 or the communication line. As a result, the time necessary for alignment can be decreased.

At S1020, the test apparatus 100 calculates the displacement amount between each test pad and the corresponding bump, based on the position information concerning the test pads and the position information concerning the bumps. In the present embodiment, the X-direction displacement amounts are calculated as $X_2$, $X_4$, $X_6$, and $X_8$, and the Y-direction displacement amounts are calculated as $Y_2$, $Y_4$, $Y_6$, and $Y_8$. The test apparatus 100 calculates the maximum value among these displacement amounts in the positive and negative X direction and in the positive and negative Y direction. In FIG. 8, for example, the maximum value in the positive X direction, the maximum value in the negative X direction, the maximum value in the positive Y direction, and the maximum value in the negative Y direction are respectively $X_2$, $X_4$, $Y_4$, and $Y_6$.

The test apparatus 100 determines the relative positions of the wafer 810 and the probe card 820 based on the displacement amount maximum values obtained in this way. For example, the test apparatus 100 determines the relative positions of the wafer 810 and the probe card 820 such that each displacement amount maximum value is less than a predetermined value.

At S1020, the test apparatus 100 may calculate the displacement amount between each bump and the corresponding test pad in the aligned state, based on the relative positions determined for the wafer 810 and the probe card 820. The test apparatus 100 may store this displacement amount for each bump.

The predetermined value described above may be different for each direction. For example, the predetermined value in the X direction may be different from the predetermined value in the Y direction. If analysis of the test results indicates that the probe card is prone to displacement in a particular direction, for example, the test apparatus 100 may set the predetermined value in this direction to be less than the predetermined value in the other direction. As a result, more stable testing can be achieved.

As another example of the method for determining the relative positions, the test apparatus 100 may determine the relative positions of the wafer 810 and the probe card 820 such that the sum of the absolute values of the maximum values described above is less than a predetermined value. When calculating the sum of the absolute values of the maximum values, the test apparatus 100 may give different weight to each direction.

Next, at S1030, the test apparatus 100 aligns the wafer 810 and the probe card 820 based on the relative positions of the wafer 810 and the probe card 820 determined at S1020. After this, at S1040, the test apparatus 100 tests the wafer 810. At S1050, the test apparatus 100 judges whether the test results indicate the wafer 810 to be acceptable or defective. Also at S1050, the test apparatus 100 may store the test results of the wafer 810 in the storage section in association with each of the bumps. For example, when the test results of a device corresponding to a test pad 812 indicate a defect, the test apparatus 100 may store the test results of this device in association with the corresponding bump 822.

When the test results of the wafer 810 at S1050 indicate acceptability, the testing is finished. When the test results of the wafer 810 at S1050 indicate a defect, the test apparatus 100 may analyze the cause of this defect at S1060. For example, when the displacement amount at the defective location is less than a prescribed value, the test apparatus 100 may judge the problem to be in the wafer 810 or the probe card 820. On the other hand, when the displacement amount at the defective location is greater than a prescribed value, the test apparatus 100 may judge the problem to be in the connection between the wafer 810 and the probe card 820. After analyzing the cause of the defect, testing is finished.

By using the above processes, the test apparatus 100 acquires the position information concerning the test pads and the position information concerning the bumps from the wafer 810 and the probe card 820 and, based on the maximum values of the displacement amounts between the test pads and the corresponding bumps, determines the relative positions of the wafer 810 and the probe card 820. As a result, even when the relative positions of the test pads and the corresponding bumps are displaced from the relative positions according to the design, the connections between all of the test pads and the bumps can be improved.

Figure 11:
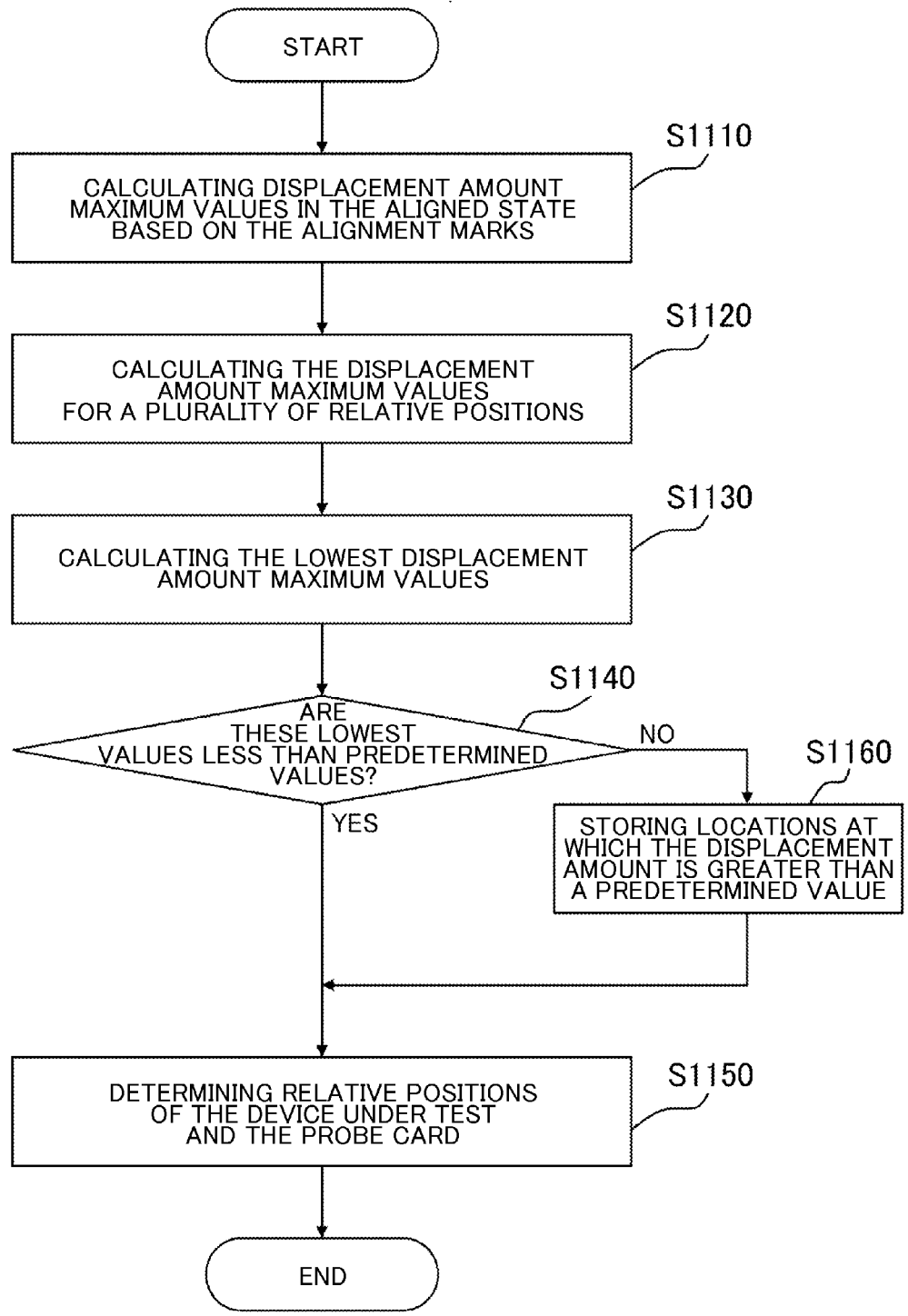
FIG. 11 is a flow chart showing a method for determining the relative positions, as performed in S1020.

FIG. 11 is a flow chart showing a method for determining the relative positions, as performed in S1020 of FIG. 10. FIG. 11 is used to describe an example of determining the relative positions of the wafer 810 and the probe card 820 to minimize the maximum values of the displacement amounts described above.

At S1110, the test apparatus 100 calculates the displacement amount between each test pad and the corresponding bump while assuming that the wafer 810 and the probe card 820 are aligned in a manner such that the alignment marks 811 match the alignment marks 821. These displacement amounts can be calculated by processing the position information concerning the test pads and the position information concerning the bumps acquired at S1010 of FIG. 10. As described above, in the present embodiment, the maximum value in the positive X direction, the maximum value in the negative X direction, the maximum value in the positive Y direction, and the maximum value in the negative Y direction are respectively $X_2$, $X_4$, $Y_4$, and $Y_6$.

At S1120, the test apparatus 100 calculates the maximum values of the displacement amounts between the test pads and the bumps, in the same manner as in S1110, for each of a plurality of relative positions of the wafer 810 and the probe card 820. For example, the test apparatus 100 may sequentially change the relative position of the wafer 810 or the probe card 820 by 0.1 micrometers in the positive X direction from the state of S1110 and, for each of these relative positions, calculate the maximum values of the displacement amounts between the test pads and the bumps. A maximum value of the displacement amounts may be calculated for each of the positive X direction, the negative X direction, the positive Y direction, and the negative Y direction.

When the test pads 812 and the bumps 822 are not in contact with each other, the test apparatus 100 sequentially changes the relative position of the probe card 820 with respect to the wafer 810 by 0.1 micrometer in the negative X direction from the state of S1110 and, for each of these relative positions, calculates the maximum values of the displacement amounts between the test pads and the corresponding bumps. When the test pad 814 and the bump 824 are not in contact with each other, the test apparatus 100 sequentially changes the relative position of the probe card 820 with respect to the wafer 810 by 0.1 micrometer in the positive Y direction from the state of S1110 and, for each of these relative positions, calculates the maximum values of the displacement amounts between the test pads and the corresponding bumps.

When the test pad 814 and the bump 824 are not in contact with each other, the test apparatus 100 sequentially changes the relative position of the probe card 820 with respect to the wafer 810 by 0.1 micrometer in the negative Y direction from the state of S1110 and, for each of these relative positions, calculates the maximum values of the displacement amounts between the test pads and the corresponding bumps. When the test pad 816 and the bump 826 are not in contact with each other, the calculation of the maximum values of the displacement amounts is finished. In this way, the test apparatus 100 can obtain the maximum values of the displacement amounts between each test pad and the corresponding bump for each of a plurality of relative positions of the wafer 810 and the probe card 820.

At S1130, the test apparatus 100 estimates the case in which the maximum values of the displacement amounts are at a minimum, based on the maximum values of the displacement amounts described above. For example, when a maximum value is calculated for each of the four directions, the test apparatus 100 estimates the maximum values of the displacement amounts to be at a minimum when the sum of the absolute values of the maximum values in the four directions is at a minimum. When calculating the sum of the absolute values of the maximum values, the test apparatus 100 may weight certain values. This weighting may be performed according to the displacement direction or a function of a test pad or a bump. As another example, suitable interpolation may be used to estimate the case in which the maximum values of the displacement amounts are at a minimum.

At S1140, the test apparatus 100 judges whether the maximum values of the displacement amounts estimated at S1130 are less than the predetermined values. At S1140, the test apparatus 100 determines the alignment of the wafer 810 and the probe card 820 using the relative positions of the wafer 810 and the probe card 820 in a case where the maximum values of the displacement amounts estimated as being the minimum are less than the predetermined values.

Instead, if at S1140 it is judged that the maximum values of the displacement amounts are not less than the predetermined values, at S1160 the test apparatus 100 may record which test pads and bumps have displacement amounts greater than the predetermined values. As a result, a user or the like can be informed of this displacement without actually testing these locations. After this, the test apparatus 100 finishes determining the relative positions.

Figure 12:
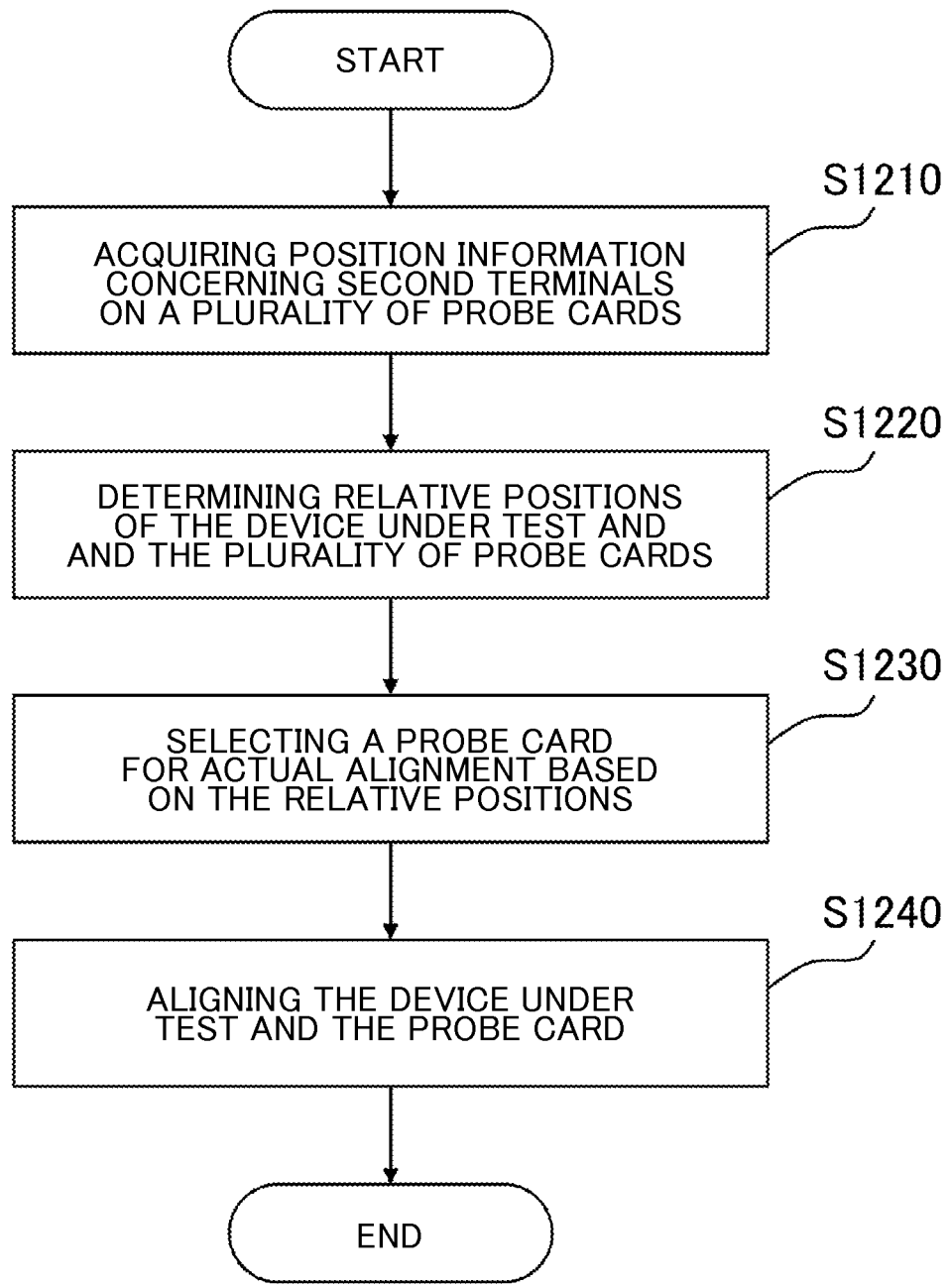
FIG. 12 is a flow chart showing a testing method performed by the test apparatus 100.

FIG. 12 is a flow chart showing a testing method performed by the test apparatus 100. FIG. 12 describes an example in which a plurality of probe cards 820 are prepared and a probe card 820 having a favorable connection with the wafer 810 is selected therefrom.

At S1210, the test apparatus 100 acquires position information concerning the bumps on each probe card 820. The test apparatus 100 also acquires position information concerning the test pads on the wafer 810. Next, at S1220, the test apparatus 100 determines the relative positions of the wafer 810 and each of the probe cards 820, in the same manner as described in relation to FIGS. 10 and 11.

At S1230, the test apparatus 100 determines which of the probe cards 820 to align with the wafer 810. At S1230, the test apparatus 100 selects the one probe card 820 from among the plurality of probe cards 820 by comparing the maximum values of the displacement amounts for the relative positions determined at S1220. At this time, the test apparatus 100 may perform weighting according to the displacement direction or functions of a test pad or a bump.

At S1240, the test apparatus 100 aligns the probe card 820 selected at S1230 with the wafer 810. At S1240, the test apparatus 100 aligns the wafer 810 and the probe card 820 based on the relative positions determined at S1220. As a result, more stable testing can be performed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

As made clear from the above, the embodiments of the present invention can be used to realize a test apparatus comprising (i) a position information acquiring section that acquires position information concerning a plurality of first terminals on a surface of a device under test and position information concerning a plurality of second terminals on a surface of a probe card used for testing the device under test, (ii) a control section that calculates a displacement amount between each first terminal and a corresponding second terminal, based on the position information concerning the first terminals and the position information concerning the second terminals acquired by the position information acquiring section, and determines relative positions of the device under test and the probe card such that a maximum value from among the calculated displacement amounts is less than a predetermined value, and (iii) an aligning section that adjusts the relative positions of the device under test and the probe card, based on a signal from the control section, and electrically connects the device under test to the probe card.

What is claimed is:

1. A test apparatus comprising:
  a position information acquiring section operable to acquire position information concerning a plurality of first terminals on a surface of a device under test and position information concerning a plurality of second terminals on a surface of a probe card used for testing the device under test;
  a control section operable to calculate a displacement amount between each first terminal and a corresponding second terminal, based on the position information concerning the first terminals and the position information concerning the second terminals acquired by the position information acquiring section, and relative positions of the device under test and the probe card such that a maximum displacement amount from among the calculated displacement amounts is less than a predetermined value;
  a first storage section operable to store, in association with each second terminal, the displacement amount corresponding to the relative positions determined by the control section;

an aligning section operable to adjust the relative positions of the device under test and the probe card based on a signal from the control section;

a test head operable to test the device under test electrically connected to the probe card;

a second storage section operable to store results of the test in association with each second terminal; and an analyzing section operable to, when the test indicates that the device under test is defective, (i) judge there to be a problem in the device under test or the probe card when the displacement amount of a location of the defect is less than a predetermined value and (ii) judge there to be a problem in the connection between the device under test and the probe card when the displacement amount of the location of the defect is greater than the predetermined value.

2. The test apparatus according, to claim 1, further comprising:

a plurality of the probe cards; and a plurality of test heads that correspond to the plurality of probe cards and are operable to test the device under test, wherein each probe card is operable to electrically connect the device under test to the corresponding test head.

3. The test apparatus of claim 1, wherein the position information acquiring section is an image capturing section operable to capture an image of at least one of the surface of the device under test and the surface of the probe card.

4. A test method comprising:

acquiring position information concerning a plurality of first terminals on to surface of a device under test and position information concerning a plurality of second terminals on a surface of a probe card used for testing the device under test, calculating a displacement amount between each first terminal and a corresponding second terminal, based on the position information concerning the first terminals and the position information concerning the second terminals; and aligning the device under test and the probe card such that a maximum displacement amount from among the calculated displacement amounts is less than a predetermined value, wherein acquiring the position information includes:
preparing a plurality of the probe cards, and
acquiring the position information concerning the second terminals for each probe card, the aligning includes:
determining the relative positions of the device under test and each probe card such that the maximum displacement amount from among the displacement amounts for each probe card is less than a predetermined value, and
selecting one of the probe cards based on the maximum displacement amounts for the determined relative positions, and the device under test is aligned with the selected probe card based on the determined relative positions.

5. The test method according to claim 4, wherein the device under test and the probe card are aligned in a manner to minimize the maximum displacement amount.

6. The test method according to claim 4, wherein the aligning includes:

calculating the maximum displacement amount for each of a plurality of relative positions of the device under test and the probe card.

7. The test method according to claim 4, further comprising:

calculating a displacement amount between each second terminal and the corresponding first terminal in an aligned state, based on the position information concerning the first terminals and the position information concerning the second terminals;

storing the displacement information in the aligned state for each second terminal;

testing the device under test;

storing results of the test in association with each second terminal; and when the test indicates that the device under test is defective, (i) judging there to be a problem in the device under test or the probe card when the displacement amount in the aligned state of a location of the defect is less than a predetermined value and (ii) judging there to be a problem in the connection between the device under test and the probe card when the displacement amount in the aligned state of the location of the defect is greater than the predetermined value.

8. A non-transitory computer readable medium storing thereon a program for use by a computer functioning as a test apparatus that tests a device under test, the program causing the computer to perform operations comprising:

acquiring position information concerning a plurality of first terminals on a surface of the device under test and position information concerning a plurality of second terminals on a surface of a probe card used for testing the device under test;

calculating, a displacement amount between each first terminal and a, corresponding second terminal, based on the position information concerning the first terminals and the position information concerning the second terminals; and aligning the device under test and the probe card such that a maximum displacement amount from among the calculated displacement amounts is less than a predetermined value, wherein acquiring the position information includes:
preparing a plurality of the probe cards; and
acquiring the position information concerning the second terminals for each probe card, the aligning includes:
determining the relative positions of the device under test and each probe card such that the maximum displacement amount from among the displacement amounts for each probe card is less than a predetermined value; and
selecting one of the probe cards based on the maximum displacement amounts for the determined relative positions, and the device under test is aligned with the selected probe card based on the determined relative positions.

* * * * *